United States Patent
Morikawa et al.

(10) Patent No.: US 11,458,513 B2
(45) Date of Patent: Oct. 4, 2022

(54) CHARGED PARTICLE BEAM APPARATUS AND CLEANING METHOD

(71) Applicant: Hitachi High-Technologies Corporation, Tokyo (JP)

(72) Inventors: Akinari Morikawa, Tokyo (JP); Kotaro Hosoya, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 412 days.

(21) Appl. No.: 16/616,165

(22) PCT Filed: Jun. 21, 2017

(86) PCT No.: PCT/JP2017/022854
§ 371 (c)(1),
(2) Date: Nov. 22, 2019

(87) PCT Pub. No.: WO2018/235194
PCT Pub. Date: Dec. 27, 2018

(65) Prior Publication Data
US 2020/0206789 A1 Jul. 2, 2020

(51) Int. Cl.
*B08B 7/00* (2006.01)
*H01J 37/20* (2006.01)
(Continued)

(52) U.S. Cl.
CPC ............ *B08B 7/0035* (2013.01); *H01J 37/20* (2013.01); *H01J 37/26* (2013.01);
(Continued)

(58) Field of Classification Search
CPC ......... B08B 7/0035; H01J 37/20; H01J 37/26; H01J 37/02; H01J 37/32862;
(Continued)

(56) References Cited

U.S. PATENT DOCUMENTS 5,922,179 A * 7/1999 Mitro ................... C23C 14/022
204/298.36
6,407,385 B1 * 6/2002 Okada ................. G03F 7/70925
850/16

(Continued)

FOREIGN PATENT DOCUMENTS

| JP | 59-146145 A | 8/1984 |
|---|---|---|
| JP | 10-154478 A | 6/1998 |

(Continued)

OTHER PUBLICATIONS

Japanese-language Office Action issued in Japanese Application No. JP 2019-524775 dated Oct. 13, 2020 with English translation (14 pages).

(Continued)

*Primary Examiner* — Kiet T Nguyen
(74) *Attorney, Agent, or Firm* — Crowell & Moring LLP

(57) ABSTRACT

To provide a charged particle beam apparatus. The charged particle beam apparatus includes: a stage on which a sample is placed; a cleaner configured to remove a contaminant on the sample; and a stage control unit configured to adjust a relative positional relationship between the cleaner and the sample by moving the stage during use of the cleaner.

12 Claims, 9 Drawing Sheets

(51) Int. Cl.
*H01J 37/26* (2006.01)
*H01J 37/32* (2006.01)

(52) U.S. Cl.
CPC ............. *H01J 37/32862* (2013.01); *H01J 2237/20207* (2013.01); *H01J 2237/20214* (2013.01)

(58) Field of Classification Search
CPC ... H01J 2237/20207; H01J 2237/20214; H01J 2237/022; G01N 1/34
USPC .............................................. 250/310; 134/1
See application file for complete search history.

(56) References Cited

U.S. PATENT DOCUMENTS

| | | | | |
|---|---|---|---|---|
| 6,677,586 | B1* | 1/2004 | Nasser-Ghodsi | .... G01N 23/225 250/311 |
| 2003/0137662 | A1* | 7/2003 | Janik | .................. G01N 21/211 356/369 |
| 2004/0108067 | A1 | 6/2004 | Fischione et al. | |
| 2006/0138363 | A1 | 6/2006 | Yonezawa et al. | |
| 2015/0206706 | A1 | 7/2015 | Man | |
| 2016/0247662 | A1 | 8/2016 | Fujii et al. | |
| 2017/0133197 | A1 | 5/2017 | Kawai | |
| 2018/0166272 | A1* | 6/2018 | Rue | ................... H01L 21/31122 |

FOREIGN PATENT DOCUMENTS

| | | |
|---|---|---|
| JP | 11-204400 A | 7/1999 |
| JP | 2001-110346 A | 4/2001 |
| JP | 2002-12971 A | 1/2002 |
| JP | 2002-310959 A | 10/2002 |
| JP | 2003-157788 A | 5/2003 |
| JP | 2015-159108 A | 9/2015 |
| JP | 2017-37811 A | 2/2017 |

OTHER PUBLICATIONS

Chinese-language Office Action issued in Chinese Application No. 201780092133.8 dated Nov. 26, 2021 (nine (9) pages).
International Search Report (PCT/ISA/210) issued in PCT Application No. PCT/JP2017/022854 dated Sep. 19, 2017 with English translation (five (5) pages).
Japanese-language Written Opinion (PCT/ISA/237) issued in PCT Application No. PCT/JP2017/022854 dated Sep. 19, 2017 (five (5) pages).

* cited by examiner

[FIG. 1]
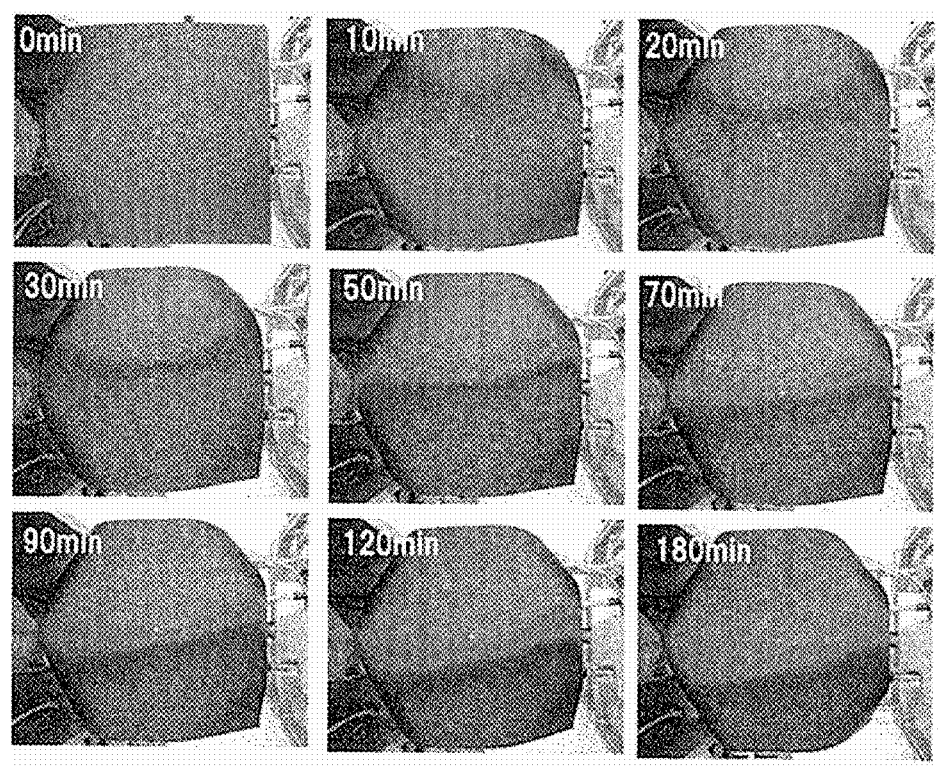

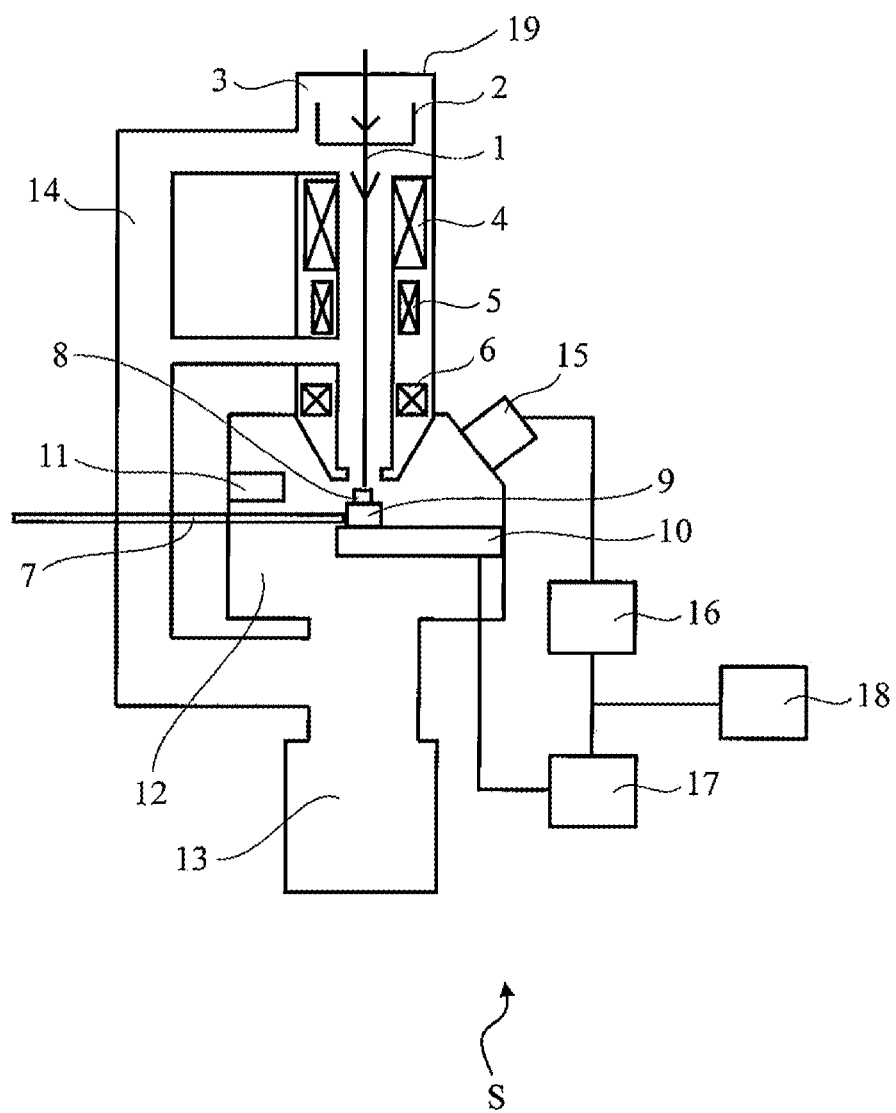
[FIG. 2]

[FIG. 3]
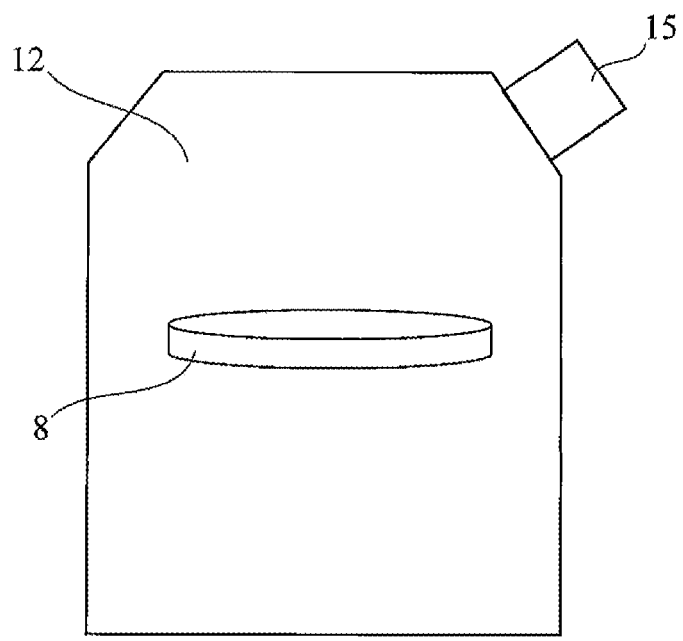
[FIG. 4]
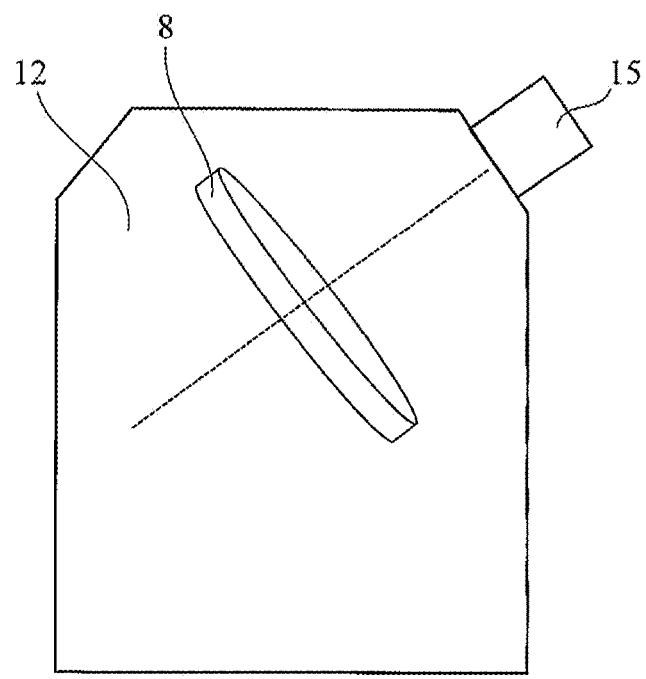

[FIG. 5A]
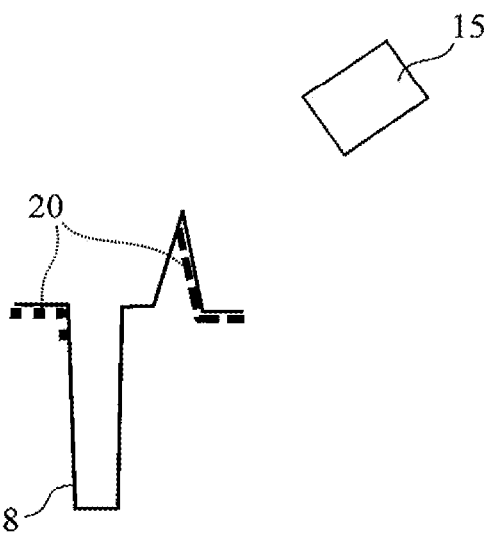
[FIG. 5B]
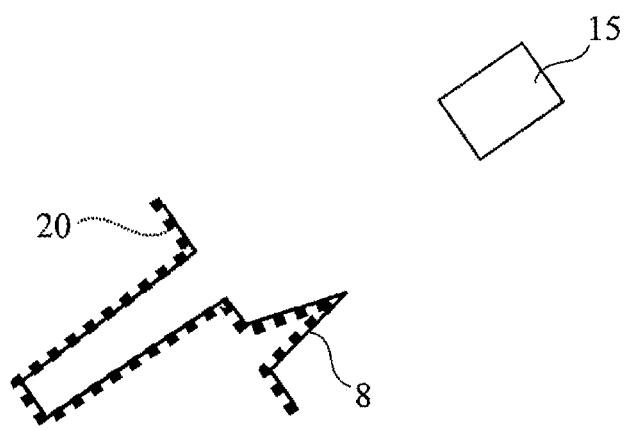

[FIG. 6]
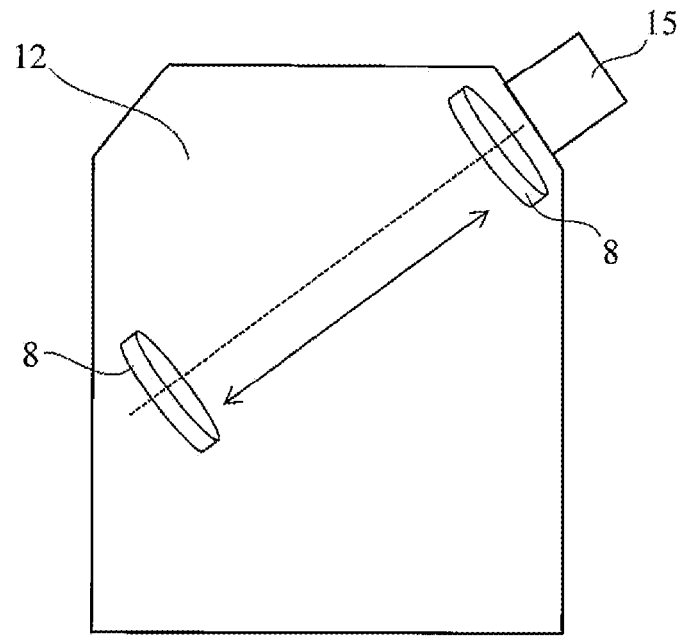
[FIG. 7]
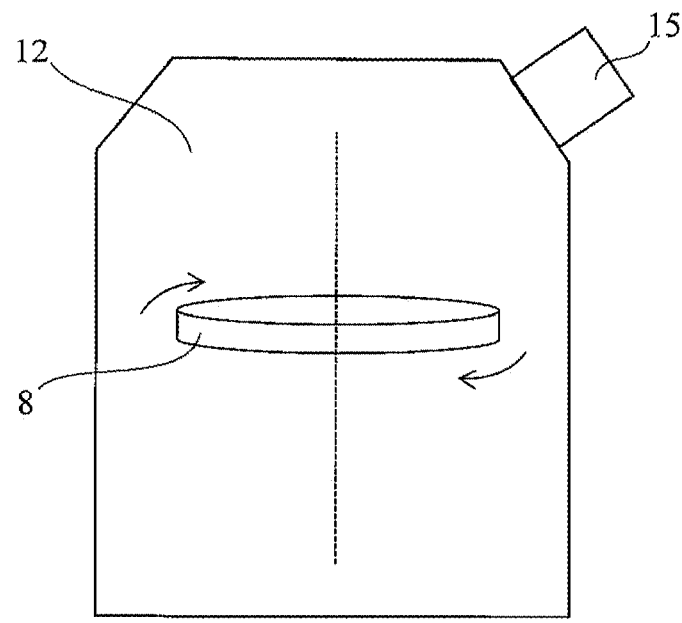

[FIG. 8A]
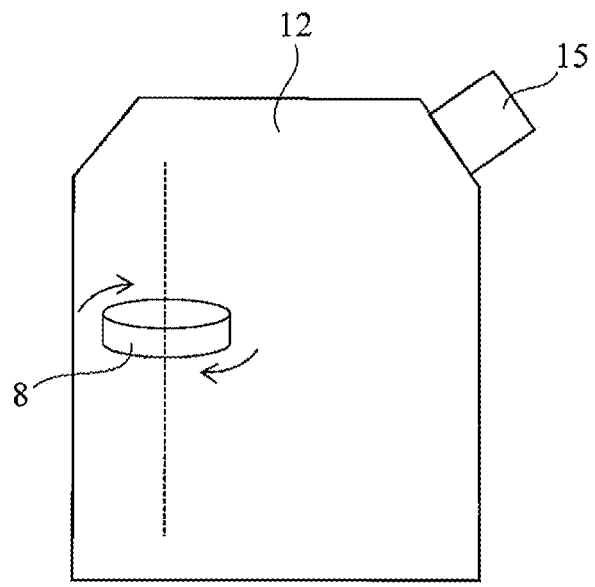
[FIG. 8B]
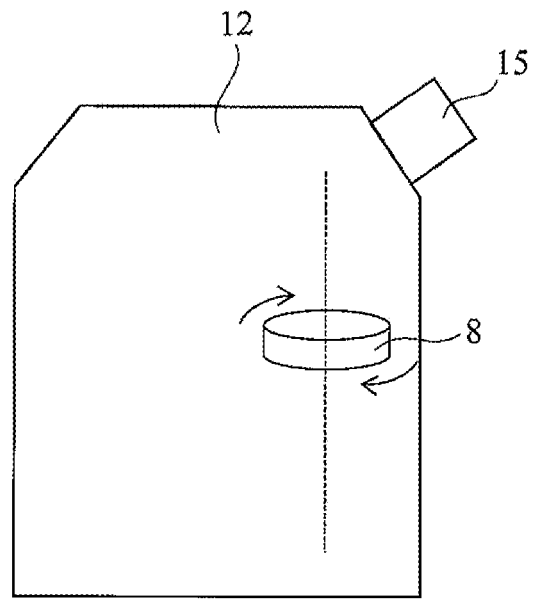

[FIG. 9]
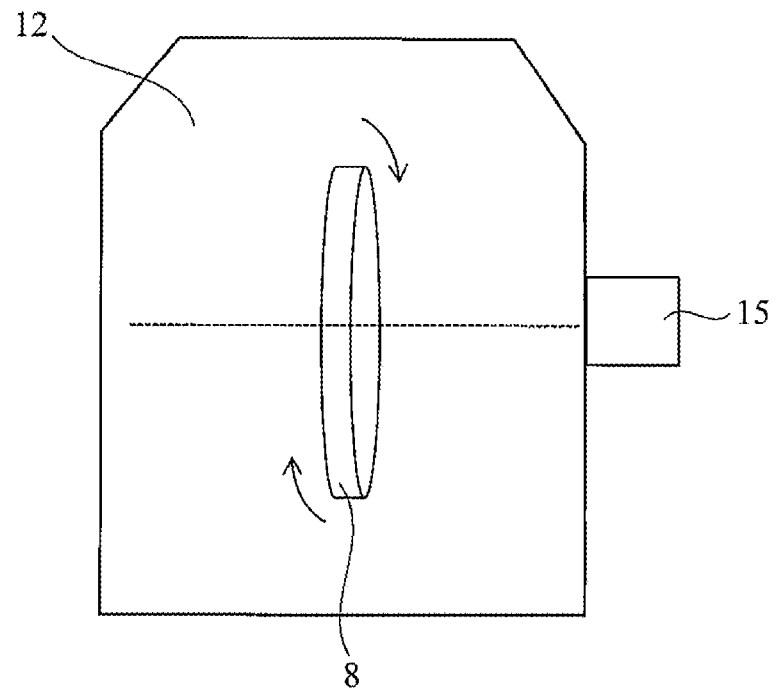
[FIG. 10A]
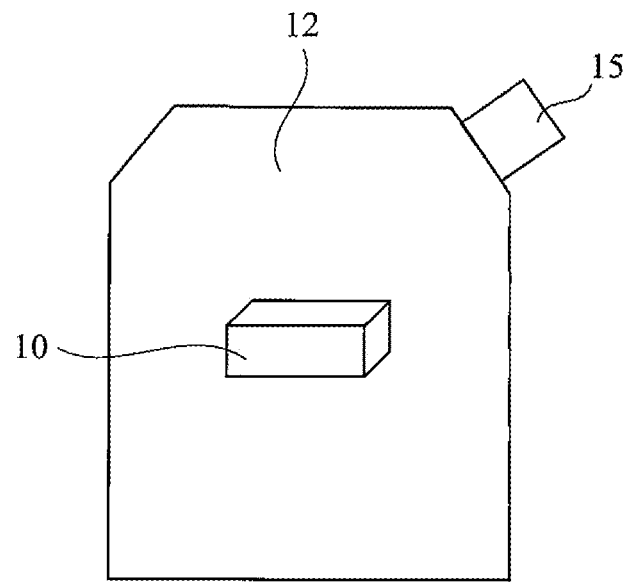

[FIG. 10B]
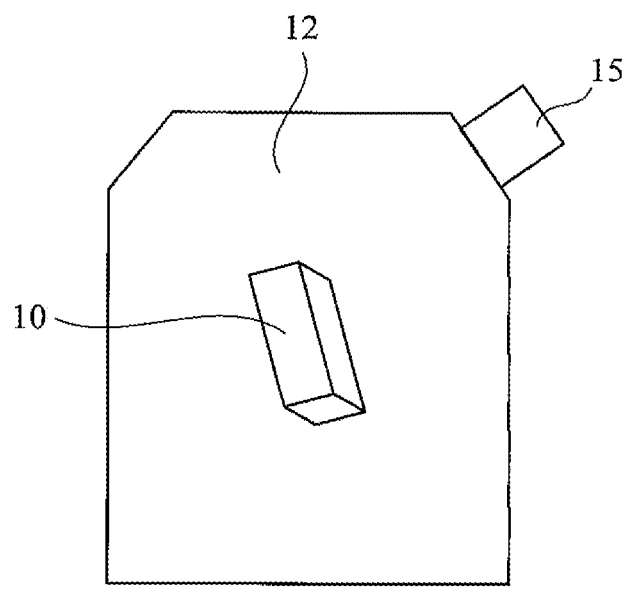

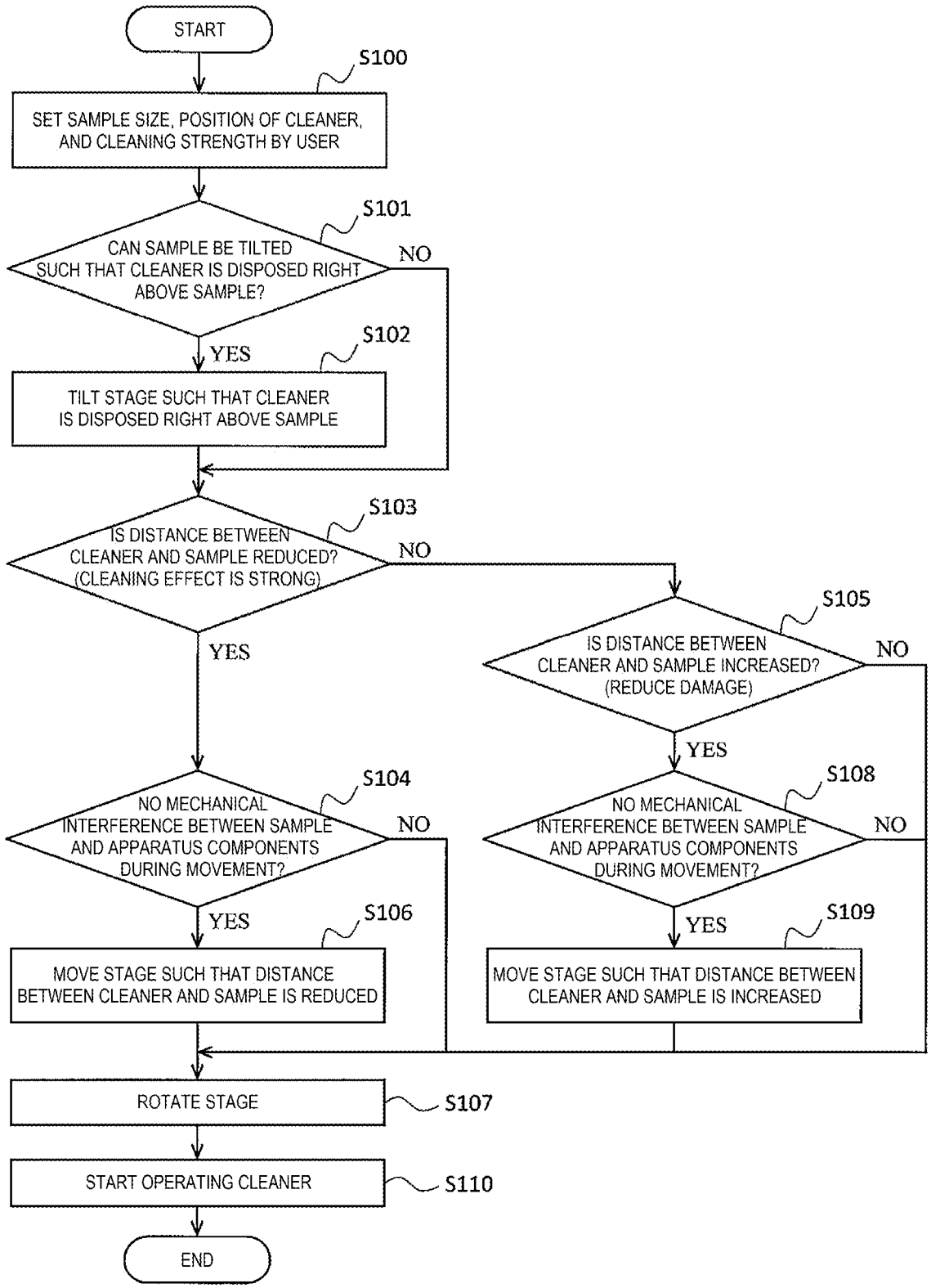

CHARGED PARTICLE BEAM APPARATUS AND CLEANING METHOD

TECHNICAL FIELD

The present invention relates to a charged particle beam apparatus having a function of removing a contaminant on a sample and a contaminant in the apparatus and a cleaning method.

BACKGROUND ART

In recent years, a Scanning Electron Microscopy (SEM), a Transmission Electron Microscopy (TEM), or a Scanning Transmission Electron Microscopy (STEM) has been frequently used for analysis of a sample having a fine structure.

When it is necessary to make a cross section of the sample or make a thin film, a Focused Ion Beam (FIB) apparatus, an ion milling apparatus, and the like are used. Further, in recent years, a composite apparatus (FIB-SEM) of the SEM and the FIB has been widely used.

When the sample is observed using these charged particle beam apparatuses, sample contamination is a serious problem. The sample contamination is a phenomenon in which a hydrocarbon-based gas adsorbed on a sample surface is decomposed by secondary electrons emitted when the sample is irradiated with a charged particle beam, and a solid substance that is amorphous carbon adheres to the sample surface. When the sample contamination occurs, a microstructure is enlarged or a coating is generated on the surface. Therefore, an original surface structure of the sample may not be observed.

For the reasons described above, an observation environment with a low degree of the sample contamination is strongly required. To date, various measures have been taken to reduce the sample contamination such as reducing a carbon-based gas emitted to a sample chamber.

PTL 1 discloses a method of locally lowering a partial pressure in the vicinity of a sample, in which a cold trap formed of a metal plate is disposed between an objective lens and a sample, and molecules in a sample chamber are adsorbed by the metal plate cooled to a temperature of liquid nitrogen.

PTL 2 discloses a method of removing adhered carbon by irradiating a sample with active oxygen so as to reduce a degree of sample contamination.

PRIOR ART LITERATURE

Patent Literature

PTL 1: JP-A-2001-110346
PTL 2: JP-A-H10-154478

SUMMARY OF INVENTION

Technical Problem

However, the inventors of the description have found that an effect of an apparatus (cleaner), which can decompose or remove a substance (hydrocarbon-based gas) which causes the sample contamination or a contaminant on a sample by acting on the substance or the contaminant itself, tends to be biased depending on a distance to the sample.

Specifically, when a target is positioned in the vicinity of the cleaner, a cleaning effect is high, whereas when the target is positioned at a location away from the cleaner, the cleaning effect is reduced.

FIG. 1 is a diagram showing a state where a sample surface changes for every operation time of a cleaner. In this experiment, the cleaner is positioned obliquely above the sample and a distance from the sample surface to the cleaner is not uniform.

In photographs of the sample shown in FIG. 1, discolored locations are regions where a cleaning effect appears. As shown in FIG. 1, the longer the time when the cleaner is operated, the wider the region where the cleaning effect appears, and the cleaning effect appears from a portion on the sample surface close to the cleaner.

The cleaner mounted in an electron microscope apparatus is difficult to be disposed right above the sample because of a structure thereof. Therefore, a distance from the cleaner to the sample surface varies, and the cleaning effect on the sample is biased as described above.

In addition, when there is a blocking object between the cleaner and the sample or there is unevenness in a shape of the sample surface, a cleaning efficiency of a region on the sample surface that is not directly viewed by the cleaner may be significantly reduced.

If the cleaning effect is biased, a part of the sample may not be sufficiently cleaned, while another part of the sample may be damaged because an effect of the cleaner, for example, an effect of oxygen radicals, is too strong.

The cleaning effect of the sample largely depends on performance of the cleaner itself, and until now there has been no means for adjusting the effect without replacing the cleaner. For example, even when it is desired to shorten a cleaning processing time, there has been no function for increasing the cleaning effect in the electron microscope main body in the related art.

When the sample is a polymer, the sample surface is likely to be damaged due to operation of the cleaner. When a position of the sample is close to the cleaner, the sample is likely to be damaged by effects such as heat and charged particles. In the case of such a sample, since there is no mechanism that controls the positions of the cleaner and the sample in a related apparatus, it is difficult to avoid the damage.

The description has been made in view of the above circumstances, and provides a technology that can improve a cleaning effect of a cleaner on a sample.

Solution to Problem

The description includes a plurality of means for solving the above problems, but one example thereof is described. There is provided a charged particle beam apparatus including: a stage on which a sample is placed; a cleaner configured to remove a contaminant on the sample; and a stage control unit configured to adjust a relative positional relationship between the cleaner and the sample by moving the stage during use of the cleaner.

Further, another example is described. There is provided a cleaning method performed by a charged particle beam apparatus, in which the charged particle beam apparatus includes: a stage on which a sample is placed; a cleaner configured to remove a contaminant on the sample; and a stage control unit configured to move the stage, the cleaning method including: a step of adjusting, by the stage control unit, a relative positional relationship between the cleaner and the sample by moving the stage during use of the cleaner.

Advantageous Effect

According to the invention, a cleaning effect of the cleaner on the sample can be improved. Other problems, configurations, and effects will become apparent from the following description of the embodiments.

BRIEF DESCRIPTION OF DRAWINGS

FIG. 1 is a diagram showing a state where a sample surface changes for every operation time of a cleaner.

FIG. 2 is a sectional view showing the configuration of a charged particle beam apparatus according to a first embodiment.

FIG. 3 is a diagram showing a relative positional relationship between a sample and a cleaner according to a comparative example.

FIG. 4 is a diagram showing a relative positional relationship between the sample and the cleaner according to the first embodiment.

FIG. 5A is a diagram showing a comparative example in which a cleaner is positioned obliquely upward with respect to a sample.

FIG. 5B is a diagram showing the first embodiment in which the cleaner is positioned right above the sample.

FIG. 6 is a diagram showing a state where a distance between the sample and the cleaner is adjusted.

FIG. 7 is a diagram showing a state where a stage control unit rotates a stage.

FIG. 8A is a diagram showing a state where the stage control unit rotates the stage during operation of the cleaner after the sample is moved away from the cleaner.

FIG. 8B is a diagram showing a state where the stage control unit rotates the stage during the operation of the cleaner after the sample is moved close to the cleaner.

FIG. 9 is a diagram showing a state where the stage is adjusted such that a normal direction of the sample or the stage is directed to the cleaner.

FIG. 10A is a diagram showing a position of the stage when a tilt angle of the stage is minimum.

FIG. 10B is a diagram showing the position of the stage when the tilt angle of the stage is maximum.

FIG. 11 is a flowchart showing an example of an execution program.

DESCRIPTION OF EMBODIMENTS

Various embodiments of the invention will be described below with reference to the accompanying drawings. However, these embodiments are only for implementing the invention, and do not limit the technical scope of the invention. In the drawings, common components are denoted by the same reference numerals.

First Embodiment

FIG. 2 is a sectional view showing the configuration of a charged particle beam apparatus S according to the first embodiment. Here, a scanning electron microscope will be described as an example of the charged particle beam apparatus S.

The charged particle beam apparatus S includes an electron-gun chamber 3 including an electron gun 2 that emits an electron beam 1 (charged particle beam), a focusing lens 4, a deflection coil 5, an objective lens 6, a stage 10, a detector 11, a sample chamber 12, an exhaust pump 13 for maintaining a vacuum in the apparatus, an exhaust pipe 14, a cleaner control unit 16 that controls a cleaner 15, a stage control unit 17 that controls the stage 10, and an operation unit 18 that transmits an instruction signal to the cleaner control unit 16 and the stage control unit 17.

A sample 8 and a sample holder 9 are disposed in the sample chamber 12 by using a sample exchange rod 7. When tilt of the stage 10 is changed, the sample holder 9 fixes the sample 8 such that a position of the sample 8 with respect to the stage 10 is changed and the sample 8 does not fall from the stage 10. The electron gun 2, the electron-gun chamber 3, the focusing lens 4, the deflection coil 5, and the objective lens 6 are housed in a lens barrel 19.

The operation unit 18 includes, for example, an input unit that receives an instruction from a user and a processor that transmits an instruction signal to the cleaner control unit 16 and the stage control unit 17. The user can arbitrarily move the cleaner 15 and the stage 10 by inputting an instruction to the input unit. The cleaner control unit 16 and the stage control unit 17 are communicably connected to each other, and the charged particle beam apparatus S can control the cleaner 15 and the stage 10 in conjunction with each other.

The electron beam 1 emitted from the electron gun 2 is finely focused by the focusing lens 4 and the objective lens 6, and the sample 8 is scanned with the electron beam 1 by the deflection coil 5. The charged particle beam apparatus S can observe an image by capturing secondary charged particles emitted from the scanned sample 8 with the detector 11.

The cleaner 15 is disposed in the sample chamber 12 of the charged particle beam apparatus S. For example, the cleaner 15 generates ozone or the like, and removes a contaminant by changing a hydrocarbon-based molecule adsorbed or adhered to a surface of the sample 8 to carbon monoxide or carbon dioxide.

The cleaner 15 to which the technology of the invention can be applied is not limited to those that act on the contaminant on the sample by generation of plasma. The cleaner 15 refers to all cleaners intended to decompose and remove a hydrocarbon component on the stage 10 and the sample 8 by acting on a hydrocarbon-based material in the sample chamber 12. The cleaner 15 is connected to the cleaner control unit 16 for controlling the cleaner 15.

When the cleaner 15 is used, the stage control unit 17 adjusts a relative positional relationship between the cleaner 15 and the sample 8 by moving the stage 10. Here, the term "when the cleaner 15 is used" means that the stage 10 is in a position different from a position when the charged particle beam is emitted during operation of the cleaner 15, or the stage 10 is in a moving state during the operation of the cleaner 15. The stage control unit 17 transmits an instruction signal to a motor, an actuator, or the like to control a position, tilt, and a posture of the stage 10.

The stage control unit 17 or a computer (not shown) that operates the stage control unit 17 includes a recording unit and a processor that outputs an instruction signal. In the recording unit, for example, a shape of the sample chamber 12, a size of the stage 10, and a sample size are recorded as three-dimensional coordinates. Based on the coordinate data, the processor calculates a range in which the sample chamber 12, the sample 8, and the stage 10 do not physically contact each other, and generates an instruction signal that controls the stage 10. The sample size is, for example, a size of a rectangular parallelepiped or a sphere that circumscribes the sample 8.

When the sample 8 is fixed to the sample holder 9, a predetermined position of the sample holder 9 and a center of the sample 8 are fixed to coincide with each other. The center of the sample 8 is, for example, a center of a circle or a sphere that circumscribes the sample. For example, a guide or a mark is disposed at a sample input port of the charged particle beam apparatus S and at the sample exchange rod 7 such that the sample holder 9 is placed at a fixed position of the stage 10.

The configuration of the scanning electron microscope has been described above. However, the present embodiment can also be applied to a case where the cleaner 15 is attached to a focused ion beam apparatus or a composite apparatus of the scanning electron microscope and the focused ion beam apparatus. That is, the present embodiment can be applied to all apparatuses in which the cleaner 15 is attached to the charged particle beam apparatus.

Hereinafter, operation of the stage 10 for making a cleaning effect on the sample 8 uniform by adjusting the position of the stage 10 in conjunction with an operation of the cleaner 15 will be described.

FIG. 3 is a diagram showing a relative positional relationship between the sample 8 and the cleaner 15 in a comparative example. In the charged particle beam apparatus S, particles are usually emitted from above the sample 8 in a vertical direction, and therefore it is difficult to dispose the cleaner 15 right above the sample 8.

In the example shown in FIG. 3, the cleaner 15 is disposed in a direction oblique to a normal direction of the surface of the sample 8. Therefore, a part of the sample surface is close to the cleaner 15, and another part of the sample surface is away from the cleaner 15.

As described above, since a cleaning effect when the cleaner 15 is used depends on a distance from the cleaner 15 to the sample 8 serving as a target, non-uniformity of the distance leads to non-uniformity of the cleaning effect in the comparative example shown in FIG. 3.

FIG. 4 is a diagram showing a relative positional relationship between the sample 8 and the cleaner 15 according to the first embodiment. In the first embodiment, the stage control unit 17 controls the position of the stage 10 such that the cleaner 15 is positioned above the sample surface or the stage 10 in the normal direction. As a result, in the charged particle beam apparatus S according to the first embodiment, the cleaning effect on the sample surface can be equalized. The following problems can also be solved by adjusting the position of the stage 10 as described above.

As described above, when there is a blocking object between the cleaner 15 and the sample 8, the cleaning effect of the cleaner 15 is reduced. For example, when there is unevenness on the sample surface, the cleaning effect is biased between a portion that can be directly viewed by the cleaner 15 and a portion that cannot be directly viewed by the cleaner 15 on the sample surface.

When a shape of the sample 8 is like a pinhole-shaped hole, it is difficult to exert the cleaning effect on a bottom portion of the hole that cannot be directly viewed by the cleaner 15. The method according to the present embodiment, which adjusts the relative positional relationship between the sample 8 and the cleaner 15 such that the cleaner 15 is positioned above the sample surface in the normal direction, is effective for making the cleaning effect on the sample surface uniform even when the shape of the sample 8 has the unevenness. That is, the stage control unit 17 moves the stage 10 based on the shape of the sample 8, whereby the cleaning effect on the sample surface can be made uniform.

FIG. 5 shows arrangements of the cleaner 15 and the sample 8 that has the unevenness on the surface. FIG. 5A is a diagram showing a comparative example in which the cleaner 15 is positioned obliquely upward with respect to the sample 8. FIG. 5B is a diagram showing the first embodiment in which the cleaner 15 is positioned right above the sample 8. In FIGS. 5A and 5B, a region 20 where the cleaning effect is sufficiently acquired is highlighted with a dotted line.

As shown in FIG. 5A, for a region that cannot be directly viewed by the cleaner 15 on the sample surface, the cleaning effect is not sufficiently acquired. On the other hand, as shown in FIG. 5B, the stage 10 (and the sample 8) is tilted such that the cleaner 15 is positioned above the sample surface in the normal direction, whereby the bias of the cleaning effect caused by the unevenness of the sample 8 can be reduced, and the uniform cleaning effect can be imparted to the entire surface of the sample.

Second Embodiment

As described above, the distance from the cleaner 15 to the sample 8 affects a cleaning effect. The second embodiment discloses that strength of the cleaning effect can be adjusted by optionally adjusting the distance from the cleaner 15 to the sample 8.

FIG. 6 is a diagram showing a state where a distance between the sample 8 and the cleaner 15 is adjusted. If the effect of the cleaner 15 is too weak, the contaminant is left and cannot be removed. On the other hand, if the cleaning effect is too strong, damage such as changing a sample structure particularly for a material having a carbon-based element configuration such as a polymer may be caused.

In such a case, the stage control unit 17 adjusts a position of the stage 10 such that the distance between the sample 8 and the cleaner 15 is larger than a predetermined value which serves as a reference for reducing the cleaning effect. In this manner, the effect of the cleaner 15 on the sample 8 is weakened, and damage to the sample 8 can be reduced.

On the other hand, in a case of a sample that is hardly damaged by the operation of the cleaner 15, such as a material formed of a metal-based element, the user may want to acquire a stronger cleaning effect in order to shorten a processing time or the like.

In this case, the stage control unit 17 adjusts the position of the stage 10 such that the distance between the sample 8 and the cleaner 15 is smaller than a predetermined value which serves as a reference for increasing the cleaning effect, whereby the cleaning effect on the sample 8 can be improved. The predetermined value is determined for each material component of the sample 8 and serves as a reference for not changing a shape of the sample 8 even when a cleaning processing is performed.

As described above, according to the second embodiment, the stage control unit 17 adjusts the position of the stage 10, whereby the distance between the cleaner 15 and the sample 8 can be optionally adjusted and the cleaning effect can be adjusted.

Third Embodiment

When a size of the sample 8 is large, for example, in accordance with a structure in the sample chamber 12 of the charged particle beam apparatus S, the stage control unit 17 may not adjust the stage 10 such that the cleaner 15 is positioned above the sample surface in a normal direction.

For example, when a position of the lens barrel 19 is close to the sample 8 and the sample 8 is large, if the stage control unit 17 tilts the stage 10, the lens barrel 19 and the sample 8 may be in contact with each other. In such a case, the stage control unit 17 may rotate the stage 10 during operation of the cleaner 15 without tilting the stage 10.

FIG. 7 is a diagram showing a state where the stage control unit 17 rotates the stage 10. As shown in FIG. 7, the stage control unit 17 rotates the stage 10 or the sample 8, whereby bias of a cleaning effect on the sample 8 can be alleviated and the uniform cleaning effect can be acquired. This method is highly versatile because the method does not depend on a size of the sample and can be performed as long as the sample has a shape that can be introduced into an electron microscope.

Further, for example, the stage control unit 17 continuously moves the stage 10 during the operation of the cleaner 15. For example, the stage control unit 17 may continuously rotate the stage 10 during the operation of the cleaner 15. In this manner, uniformity of the cleaning effect on the sample 8 is improved.

After moving a position of the stage 10, the stage control unit 17 may rotate the stage 10 during the operation of the cleaner 15.

FIG. 8 shows states where the stage 10 is rotated at positions to which the stage is moved during the operation of the cleaner 15.

FIG. 8A is a diagram showing a state where the stage control unit 17 rotates the stage 10 during the operation of the cleaner 15 after moving the sample 8 away from the cleaner 15. The stage control unit 17 can reduce damage to the sample 8 caused by cleaning by moving a position (or a rotation axis of the stage 10) of the sample 8 to be rotated away from the cleaner 15.

FIG. 8B is a diagram showing a state where the stage control unit 17 rotates the stage 10 during the operation of the cleaner 15 after moving the sample 8 close to the cleaner 15. The stage control unit 17 can improve the cleaning effect by moving the position of the sample 8 to be rotated (or the rotation axis of the stage 10) close to the cleaner 15.

Fourth Embodiment

A mounting position of the cleaner 15 on the charged particle beam apparatus S depends on a position of an installation port of the charged particle beam apparatus S. The fourth embodiment describes a method in which the stage control unit 17 controls a position or a posture of the sample 8 or the stage 10 in accordance with the mounting position of the cleaner 15 and adjusts a cleaning effect.

For example, it is assumed that the cleaner 15 is not mounted at a position obliquely above the sample 8 but is positioned right beside the charged particle beam apparatus S. In such a case, the stage control unit 17 can control the position of the stage 10 such that the cleaner 15 is positioned in a normal direction of a sample surface or the stage 10.

FIG. 9 is a diagram showing a state where the stage 10 is adjusted such that the normal direction of the sample 8 or the stage 10 is directed to the cleaner 15. In this manner, the stage control unit 17 controls the position or the posture of the stage 10 in accordance with the position of the cleaner 15, so that a desired cleaning effect can be acquired without depending on the position of the cleaner 15.

Fifth Embodiment

The first to fourth embodiments describe the control of the stage 10 for the purpose of improving the cleaning effect on the sample 8. The fifth embodiment describes a cleaning effect on the stage 10 on which the sample 8 is mounted.

In a stage mechanism existing in the sample chamber 12, for example, a hydrocarbon-based component and an excess oil component are attached due to aging. Since the above contaminants cause sample contamination, cleaning of the stage 10 itself is also important for preventing the sample from the contamination.

According to the fifth embodiment, the stage 10 includes, for example, a mechanism that performs rotation or tilt by 180 degrees with respect to the cleaner 15. With the above configuration, the stage control unit 17 allows the stage 10 to move such that there is no region invisible from the cleaner 15.

The stage 10 may not include the mechanism as described above. In this case, for example, the stage control unit 17 repeatedly moves the stage 10 greatly within an operation range during operation of the cleaner 15. In this manner, the stage 10 can acquire a certain cleaning effect.

FIG. 10 shows movable ranges of the stage 10 in the sample chamber 12. FIG. 10A is a diagram showing a position of the stage 10 when a tilt angle of the stage 10 is the minimum. FIG. 10B is a diagram showing a position of the stage 10 when the tilt angle of the stage 10 is the maximum.

For example, during the operation of the cleaner 15, the stage control unit 17 continuously and repeatedly performs a movement of moving a stage tilt angle from a minimum value to a maximum value and then making the stage tilt angle return to the minimum value. In this manner, the cleaning effect can be improved as compared with the case where the stage 10 is not moved.

Sixth Embodiment

Next, a method will be described in which the user selects or specifies a shape of the sample 8, a mounting position of the cleaner 15 or the like via the operation unit 18 and allows the stage 10 to move in accordance with a selected condition.

Depending on a structure or a configuration in the sample chamber 12 of the charged particle beam apparatus S, or the shape of the sample, a range in which the sample can be operated in the sample chamber 12 is limited. Therefore, it is difficult for the user to determine optimum stage coordinates for acquiring a desired cleaning effect in consideration of an operation range of the stage 10, which is a time-consuming work.

Therefore, the user may set the stage control unit 17 to control the stage 10 in accordance with a program recorded in advance. For example, the user considers a position of the cleaner 15, grasps stage coordinates for acquiring the desired cleaning effect from the operation range of the stage 10 (or the sample 8), and designs a program that allows the stage 10 to move. The program is, for example, recorded via the operation unit 18 in a memory included in the operation unit 18. In this manner, a burden on the user can be reduced as compared with a case where the stage 10 is manually operated.

FIG. 11 is a flowchart showing an example of an execution program. Hereinafter, a flow of a processing in which a processor reads the program and allows the stage 10 and the cleaner 15 to perform operation will be described.

(S100)

First, the user sets, for example, a sample size, the position of the cleaner 15, and cleaning strength in the charged particle beam apparatus S via the operation unit 18.

(S101)

The processor of the stage control unit 17 refers to data such as the sample size set by the user and a shape of the sample chamber 12, and determines whether the stage 10 can be tilted such that the cleaner 15 is positioned in a normal direction of the sample 8 without mechanical interference. When the stage 10 can be tilted such that the cleaner 15 is positioned in the normal direction of the sample 8 (YES in S101), the processing proceeds to S102. When the stage 10 cannot be tilted such that the cleaner 15 is positioned in the normal direction of the sample 8 (NO in S101), the processing proceeds to S103.

(S102)

The stage control unit 17 tilts the stage 10 such that the cleaner 15 is positioned in the normal direction of the sample 8.

(S103)

The processor refers to the cleaning strength set by the user and a material of the sample 8 to determine whether a distance between the cleaner 15 and the sample 8 is reduced.

When the distance between the cleaner 15 and the sample 8 is reduced (YES in S103), the processing proceeds to S104. When the distance between the cleaner 15 and the sample 8 is not reduced (NO in S103), the processing proceeds to S105.

(S104)

When moving the stage 10 with reference to pre-recorded three-dimensional coordinates such as sizes of the sample chamber 12, the lens barrel 19 and the sample 8, the processor determines whether there is no mechanical interference between the sample 8 and apparatus components and between the stage 10 and the apparatus components. When there is no mechanical interference (YES in S104), the processing proceeds to S106. When there is mechanical interference (NO in S104), the processing proceeds to S107.

(S105)

The processor determines whether the distance between the cleaner 15 and the sample 8 is increased with reference to the cleaning strength set by the user and the material of the sample 8. When the distance between the cleaner 15 and the sample 8 is increased (YES in S105), the processing proceeds to S108. When the distance between the cleaner 15 and the sample 8 is not increased (NO in S105), the processing proceeds to S107.

(S106)

The stage control unit 17 moves the stage 10 such that the distance between the cleaner 15 and the sample 8 is reduced.

(S107)

The stage control unit 17 rotates the stage 10.

(S108)

When moving the stage 10 with reference to the pre-recorded three-dimensional coordinates such as the sizes of the sample chamber 12, the lens barrel 19 and the sample 8, the processor determines whether there is no mechanical interference between the sample 8 and the apparatus components and between the stage 10 and the apparatus components. When there is no mechanical interference (YES in S108), the processing proceeds to S109. When there is mechanical interference (NO in S108), the processing proceeds to S107.

(S109)

The stage control unit 17 moves the stage 10 such that the distance between the cleaner 15 and the sample 8 is increased.

(S110)

The cleaner control unit 16 starts an operation of the cleaner 15.

As described above, the user can perform desired cleaning on the sample only by simple condition setting by programming the control of the stage 10 in advance in consideration of a shape of the lens barrel 19 and the position of the cleaner 15.

The charged particle beam apparatus S may allow a start of a movement of the stage 10 and the operation of the cleaner 15 to be in conjunction with each other. In this manner, the user can control both the stage 10 and the cleaner 15 only by the simple setting as described above.

The user can input, via the operation unit 18, a time when the movement of the stage 10 and the operation of the cleaner 15 are started. Then, the processor starts the cleaning by allowing the stage control unit and the cleaner control unit to be in conjunction with each other at a time set in advance by the user. In this way, the cleaner 15 can be operated in an unmanned manner at an optionally set time. In addition, the charged particle beam apparatus S can automatically operate the cleaner 15 by being in conjunction with a schedule function.

REFERENCE SIGN LIST

1 electron beam
2 electron gun
3 electron-gun chamber
4 focusing lens
5 deflection coil
6 objective lens
7 sample exchange rod
8 sample
9 sample holder
10 sample stage
11 detector
12 sample chamber
13 exhaust pump
14 exhaust pipe
15 cleaner
16 cleaner control unit
17 stage control unit
18 operation unit
19 lens barrel
20 location subjected to cleaning effect All publications and patent documents cited in this description are incorporated herein by reference in their entirety.

The invention claimed is:

1. A charged particle beam apparatus comprising:
a stage on which a sample is placed;
a lens barrel in which the sample is scanned with a charged particle beam;
a cleaner configured to remove a contaminant on the sample by changing a hydrocarbon-based molecule adsorbed or adhered to a surface of the sample to carbon monoxide or carbon dioxide from a direction different from a direction in which the lens barrel is disposed;
a stage control unit configured to adjust a relative positional relationship between the cleaner and the sample by moving the stage during use of the cleaner;
wherein the stage control unit is configured to move the stage such that a distance between the sample and the cleaner is smaller than a predetermined value which serves as a reference for increasing a cleaning effect.

2. The charged particle beam apparatus according to claim 1, wherein
the stage control unit is configured to move the stage based on a shape of the sample.

3. The charged particle beam apparatus according to claim 1, wherein
the stage control unit is configured to move the stage based on a position of the lens barrel.

4. The charged particle beam apparatus according to claim 1, wherein
the stage control unit is configured to continuously move the stage during operation of the cleaner.

5. The charged particle beam apparatus according to claim 1, wherein
the stage control unit is configured to rotate the stage during operation of the cleaner.

6. The charged particle beam apparatus according to claim 1, wherein
the stage control unit is configured to tilt the stage such that the cleaner is positioned in a normal direction of the stage.

7. The charged particle beam apparatus according to claim 1, further comprising:
a cleaner control unit configured to control the cleaner; and
a processor configured to transmit an instruction signal to the stage control unit and the cleaner control unit.

8. The charged particle beam apparatus according to claim 7, wherein
the processor is configured to allow the stage control unit and the cleaner control unit to be in conjunction with each other at a time set in advance by a user.

9. A charged particle beam apparatus comprising:
a stage on which a sample is placed;
a lens barrel in which the sample is scanned with a charged particle beam;
a cleaner configured to remove a contaminant on the sample by changing a hydrocarbon-based molecule adsorbed or adhered to a surface of the sample to carbon monoxide or carbon dioxide from a direction different from a direction in which the lens barrel is disposed;
a stage control unit configured to adjust a relative positional relationship between the cleaner and the sample by moving the stage during use of the cleaner;
wherein the stage control unit is configured to move the stage such that a distance between the sample and the cleaner is larger than a predetermined value which serves as a reference for reducing a cleaning effect.

10. A cleaning method performed by a charged particle beam apparatus, wherein the charged particle beam apparatus includes:
a stage on which a sample is placed;
a lens barrel in which the sample is scanned with a charged particle beam;
a cleaner configured to remove a contaminant on the sample by changing a hydrocarbon-based molecule adsorbed or adhered to a surface of the sample to carbon monoxide or carbon dioxide from a direction different from a direction where the lens barrel is disposed;
a stage control unit configured to move the stage, the cleaning method comprising:
an adjusting step of adjusting, by the stage control unit, a relative positional relationship between the cleaner and the sample by moving the stage during use of the cleaner;
wherein the stage control unit is configured to move the stage such that a distance between the sample and the cleaner is smaller than a predetermined value which serves as a reference for increasing a cleaning effect.

11. The cleaning method according to claim 10, wherein
in the adjusting step, the stage is tilted such that the cleaner is positioned in a normal direction of the stage.

12. The cleaning method according to claim 10, wherein
in the adjusting step, the stage is rotated during operation of the cleaner.

* * * * *